United States Patent
Cole et al.

(10) Patent No.: US 12,041,431 B1
(45) Date of Patent: *Jul. 16, 2024

(54) SYSTEM AND METHOD FOR AUGMENTING VEHICLE SOUND SYSTEM

(71) Applicant: Stillwater Designs and Audio, Inc., Stillwater, OK (US)

(72) Inventors: Austin Brody Cole, Stillwater, OK (US); Joe H. Hobart, Stillwater, OK (US)

(73) Assignee: Stillwater Designs and Audio, Inc., Stillwater, OK (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/058,871

(22) Filed: Nov. 27, 2022

Related U.S. Application Data

(63) Continuation of application No. 17/318,649, filed on May 12, 2021, now Pat. No. 11,570,548.

(60) Provisional application No. 63/024,242, filed on May 13, 2020.

(51) Int. Cl.
H04R 3/04 (2006.01)
H03G 3/30 (2006.01)

(52) U.S. Cl.
CPC ............. *H04R 3/04* (2013.01); *H03G 3/3005* (2013.01); *H04R 2420/01* (2013.01); *H04R 2430/01* (2013.01); *H04R 2499/13* (2013.01)

(58) Field of Classification Search
None
See application file for complete search history.

(56) References Cited

U.S. PATENT DOCUMENTS

2006/0088085 A1*  4/2006  Kelly ...................... H04S 7/307
375/229

\* cited by examiner

*Primary Examiner* — James K Mooney
(74) *Attorney, Agent, or Firm* — Mary M. Lee

(57) ABSTRACT

An integration unit IU for tuning an OEM sound system augmented with aftermarket components, such as an amplifier or a subwoofer. The integration unit is contained in a small housing that can be installed inconspicuously in most vehicles without removing the original head unit. The unit may comprise a DSP-based active line output converter that is configured to automatically detect the frequency response and phase of the OEM head unit. The unit performs various algorithms to detect and analyze crossovers, EQ, time delay, and allpass filters and then matches left and right audio channels. The IU may allow for low bass correction detecting and defeating the factory high pass filter. Still further, the IU can correct the various filters to ensure a clean, uncolored audio signal for the augmented components.

8 Claims, 10 Drawing Sheets

SYSTEM AND METHOD FOR AUGMENTING VEHICLE SOUND SYSTEM

CROSS-REFERENCE TO RELATED APPLICATIONS

This application is a continuation of U.S. patent application Ser. No. 17/318,649, entitled "System and Method for Augmenting Vehicle Sound System," filed May 12, 2021, which claims the benefit of U.S. provisional application No. 63/024,242, entitled "System and Method for Augmenting Vehicle Sound System," filed May 13, 2020, the contents of which are incorporated herein by reference.

FIELD OF THE INVENTION

The present invention relates to sound systems generally and, more particularly but without limitation, to devices for integrating add-on devices into original equipment manufacturer ("OEM") sound systems in vehicles.

BRIEF DESCRIPTION OF THE DRAWINGS

The accompanying drawings, which are incorporated into and form a part of the specification, illustrate one or more embodiments of the present invention and, together with this description, serve to explain the principles of the invention. The drawings merely illustrate a preferred embodiment of the invention and are not to be construed as limiting the scope of the invention.

DETAILED DESCRIPTION OF THE PREFERRED EMBODIMENT(S)

Figure 1:
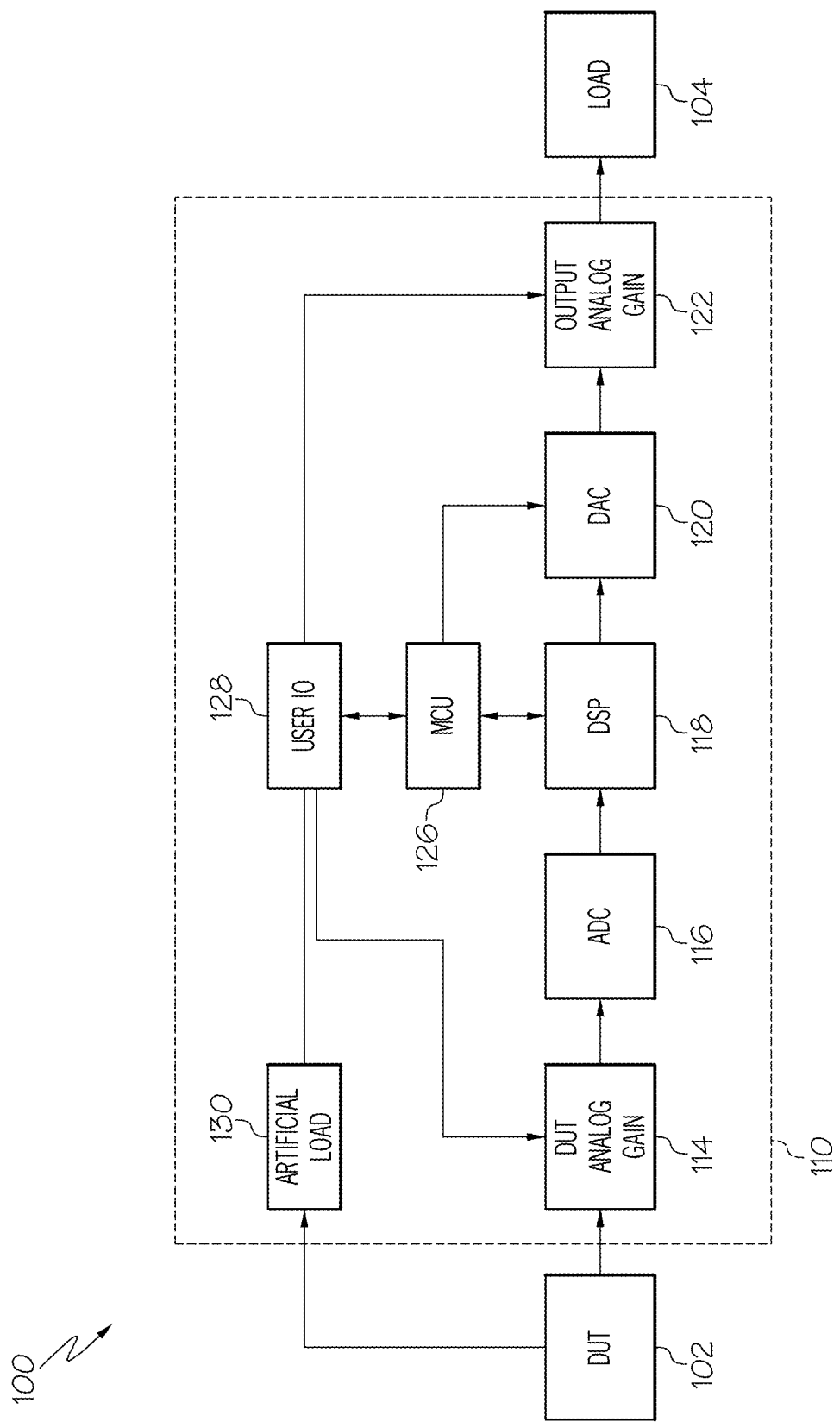
FIG. 1 is a schematic illustration of a vehicle sound system including an embodiment of the integration unit ("IU") installed in an exemplary aftermarket device.

While OEM sound systems are adequate for some drivers, audiophiles often want to add components, such as a subwoofer, to the system or to replace or upgrade the amplifier. Since the OEM head unit was tuned for the original components, retuning the head unit is necessary for optimum performance of the augmented system. The preset invention is directed to a system and method for integrating an add-on or aftermarket device into an OEM sound system in a vehicle.

The system comprises a small integration unit that can be installed inconspicuously in most vehicles without removing the original head unit. The unit may comprise a single or multi-channel DSP-based active line output converter ("LOC") that automatically detects the frequency response and phase of the OEM head unit or DUT (device under test). The IU performs various algorithms to detect and analyze crossovers, EQ, time delay, and allpass filters, and then matches left and right audio channels. The IU may allow for low bass correction detecting and defeating the factory high pass filter. Still further, the IU can correct the various filters to ensure a clean, uncolored audio signal for the augmented components.

In one embodiment, the inventive IU may have two input level ranges. The low range can accept 125 mV to 10V. The high range can accept 1V to 40V. The IU will output up to 10V, which is adjustable by the output gain of the device. In the low-level range, there is a resistive load for use with newer smart radios that shut their outputs off if they detect that there is no speaker on their outputs. The inventive IU may include other features, such as a DC offset to turn on, and may be configured to output a remote turn on (100 mA) to activate other products.

In one embodiment, the inventive IU can process the incoming audio from a factory source unit and apply various algorithms. The IU may smooth frequency response of channels of the source unit via EQ correction. The IU may fix EQs with Qs ranging from 0.5-10 with up to +/- of 12 dB of boost or cut. The IU may provide a factory time delay defeat ranging from 0.06 mS-10 mS. Additionally, the preferred IU will include an allpass filter defeat. The inventive IU may correct up to three allpass filters on one channel.

Out of the box, the IU may be in passive frequency detection mode to identify what bands of frequencies are available on the given wires, such as low (20 Hz-200 Hz), mid (200 Hz-2 kHz), and high (2 kHz-20 kHz). These and other advantages will be apparent from the following description and accompanying drawings.

As used herein, "OEM" stands for original equipment manufacturer and refers to sound system components originally installed in a vehicle by the manufacturer. "Aftermarket device" or "add-on" device means a sound system component, such as an amplifier or speaker, that is added to the vehicle's sound system after the vehicle leaves the factory. An aftermarket device can be a replacement for a component present in the OEM sound system or it can be an addition or "add on" to the original system components. "Load" refers to the components receiving the sound signal. "Source unit," as used herein, refers to the system component such as the head unit that generates the sound signal output from over the air signals, such as radio, or from recorded formats, such as CD players and other digital media, or both. While the generation of sound signals is a function of the source unit, the source unit may, of course, perform other functions as well.

Turning now to the drawings in general and to FIG. 1 in particular, there is shown therein diagrammatically a vehicle sound system designated generally by the reference number 100. The system 100 comprises a source unit or DUT 102. This may be, for example, the head unit or OEM amplifier. The DUT 102 outputs a sound signal to a load 104, which typically is an aftermarket amplifier or subwoofer. Installed between the DUT 102 and the load 104 is an integration unit IU 110 in accordance with an embodiment of the present invention.

The IU 110 may include a DUT analog gain device 114, such as an input potentiometer, to match the gain of the DUT 102. A control (not shown in FIG. 1) allows the user to amplify or attenuate the input signal as needed. The gain-adjusted signal from the potentiometer 114 is output to an analog to digital converter 116 ("ADC") to produce a digital signal usable by the digital signal processor ("DSP") 118. Sampling of the DUT's frequency response and the correction filters, described in more detail below, may be performed in the DSP 118. The processed digital signal output from the DSP 118 is input to a digital to analog converter ("DAC") 120. The processed analog signal from the DAC 120 is input to an output analog gain device 122, such as an output potentiometer, which allows the user to attenuate or amplify the corrected signal from the DUT.

The IU 110 includes a microcontroller unit MCU 126. The MCU 126 performs the calculations required by the algorithms described herein and also stores the calculated correction filter. The MCU 126 provides status indication to the user via LEDs (not shown in the figures). A zero cross detector circuit (not shown) may be included for purposes explained in detail below.

The USER TO 128 denotes the various external controls for the IU 110, which may include without limitation, control knobs for the input and output gain devices 114 and 122, a multi-function button for operating the various modes of the IU, LED indicator lights, and a high-low level switch. It will also be understood that the housing for the unit will include input and output receptacles, such as input jacks for the speaker level connections from the DUT and RCA outputs for connecting to the load. An artificial load 130 may be used when the DUT 102 has load sensing capabilities and would shut down if unloaded. It may comprise, for example, a 62 ohm load across both inputs.

Figure 2:
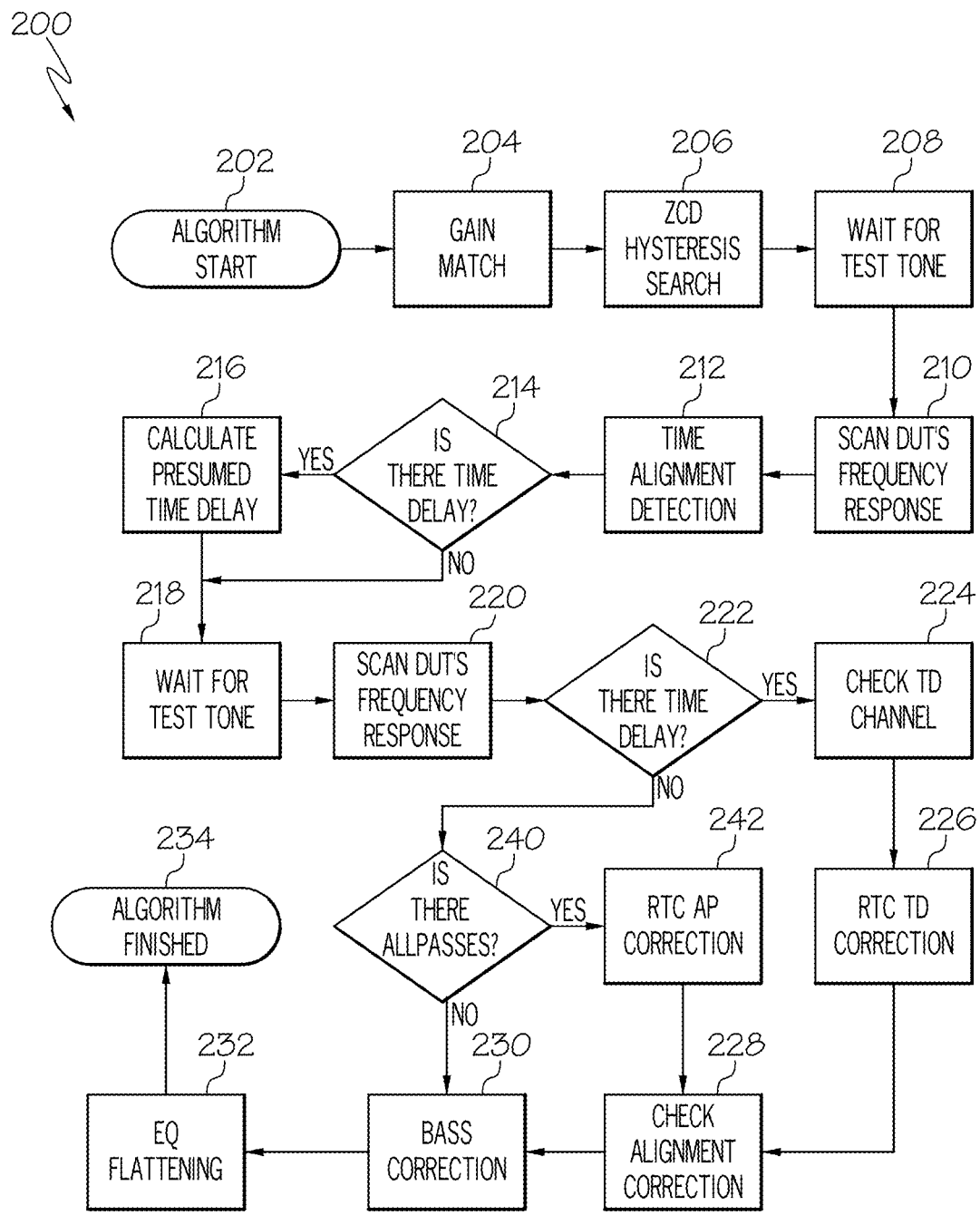
FIG. 2 is a flow chart illustrating the main steps of a method carried out by the inventive integration device for retuning the sound system in a vehicle when installing an add-on device.

Having described generally the components of the IU 110, its operation will now be explained in more detail with reference to the flowcharts in FIGS. 2-10. FIG. 2 illustrates a main algorithm 200 that processes the digitalized signal from the DUT 102. The process commences at 202 and proceeds at 204 to Gain Match.

Gain Match

To achieve an output with a dynamic range, the input level should be matched to the maximum input of the DSP 118. To match the input gain with the input to the DAC 118, a 0 db sine sweep is played in the device under test ("DUT"). As the sine sweep is playing in the DUT, the user increases the volume until the indicator shows that a channel has clipped. The IU 110 detects clipping by integrating the input signal over a small period of time and comparing it to a predefined threshold. Once the IU 110 indicates clipping, the user is instructed to turn the input gain down until the IU 110 indicates clipping has ceased, at which point the input level is matched with the input of the DSP 118.

Zero Cross Detector

An analog zero cross detector ("ZCD") may be included in the IU to detect the input frequency being played. Hysteresis is included to reduce the effect noise has on the ZCD. However, this limits dynamic range. Using a variable hysteresis circuit may minimize this effect. To calibrate the variable hysteresis circuit, a silence track is played on the DUT at 206 (FIG. 1). As this track is playing, the hysteresis is slowly lowered until the ZCD starts to switch. Once the lowest hysteresis level is found, it is multiplied by a predefined value and applied as the ZCD hysteresis level.

Delineation

Referring still to FIG. 2, several tests are performed to correct the DUT's frequency response. These test may be automated with a delineation algorithm at 208 to detect when one test ends and another begins. The IU 10 does this by counting the time between zero crosses of the input signal and analyzing if they are random. If randomness is detected for longer than a predefined time and it is followed by a predetermined amount of silence the IU 110 switches to the next test.

Figure 3:
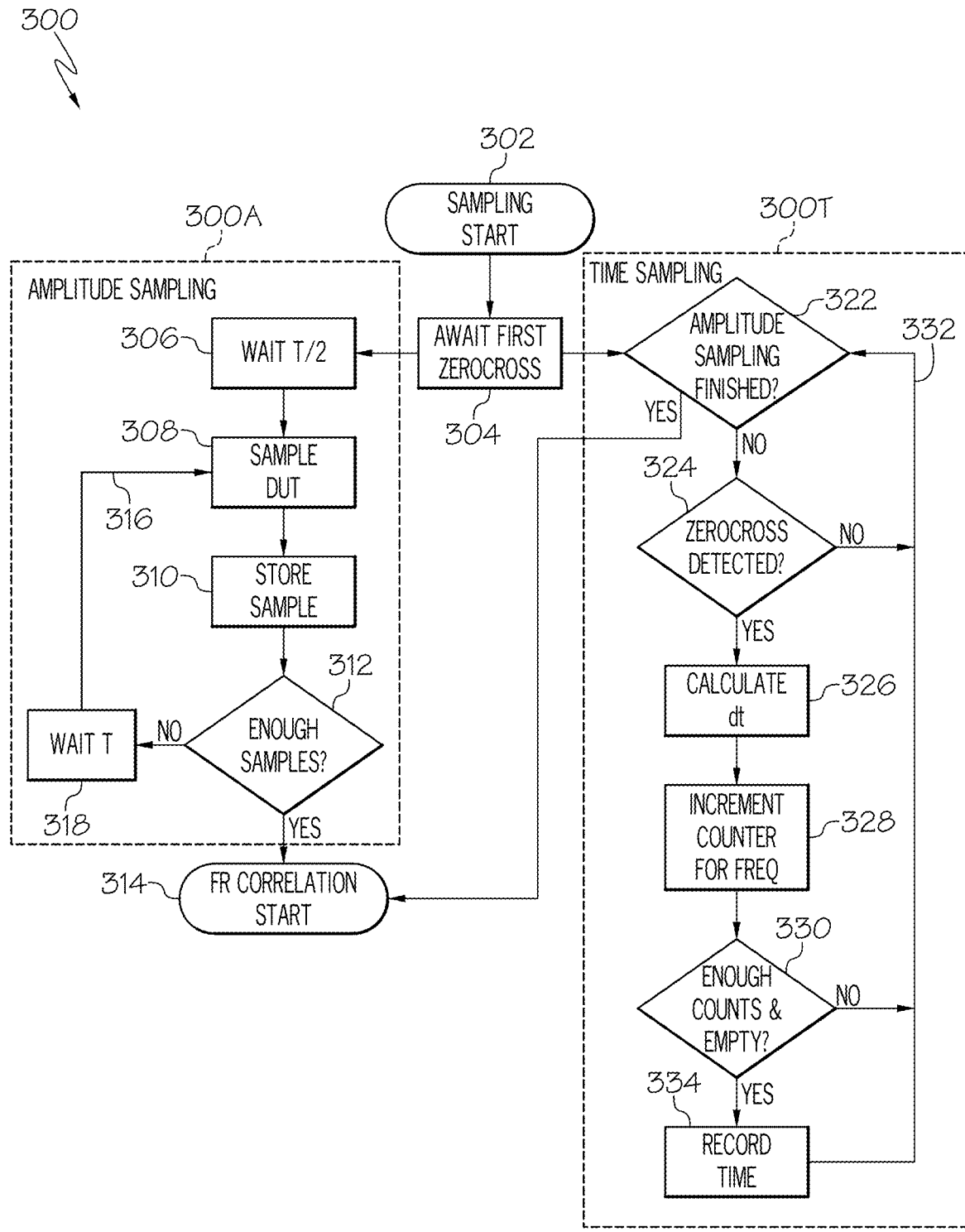
FIG. 3 is a flow chart illustrating an algorithm for sampling the frequency response ("FR") of the DUT (device under test) which may be employed by the IU.

With continuing reference to FIG. 2, the frequency response of the DUT 102 is determined at 210. To obtain the frequency response ("FR") of the DUT, the IU 110 must sample the DUT. Due to limitations in DSP power and speed, the standard way of sampling—using a discrete Fourier transform—was impractical. Likewise, using a large number of bandpass filters to sample the DUT's FR was not feasible because it could not provide enough bands to properly discern the FR. Still further, the IU 110 does not have control of the DUT's input. These issues are avoided by playing a test tone in the DUT. One embodiment of such a sampling algorithm is depicted in FIG. 3, to which attention now is directed.

Frequency Response Sampling

The sampling algorithm 300 begins at 302. To get the FR of the DUT 102, the algorithm 300 integrates the DUT's amplitude response over a short time and records the level in an array at a constant rate until the array is full.

To determine what samples in the level sampling section correspond to which frequency, the IU 110 uses the ZCD to obtain the among of time ("dT") between each zerocross event. The dT is then converted to frequency, and the number of occurrences of that frequency is incremented by 1. Once a predefined number of occurrences of a certain frequency is obtained, the time is recorded in the corresponding index of the time array.

When the frequency response algorithm 300 is started, it waits for the first ZCD event at 304. This indicates that the test track has started, and sampling can begin.

Each frequency index in the sampling array corresponds to a single frequency tone that lasts a predefined amount of time, T, in the test track. To get the correct amplitude at the correct frequency of the current index, the algorithm 300 waits at 306 to sample the integrated level from the DUT for T/2 seconds. This effectively means that the amplitude is sampled in the middle of the corresponding frequency tone in the test track.

Once the amplitude is sampled from the DUT 102 at 308, the sample is stored at 310 in the level sampling array, and the time is recorded in the level sampling time array. If at 312 the level sampling array is full, the frequency response sampling is stopped and proceeds to FR correlation at 314. Otherwise, the level sampling is repeated at 316. By waiting for T seconds at 318, the amplitude sampling algorithm 300A effectively puts the next amplitude sample in the middle of the next frequency tone of the test track.

The time sampling algorithm 300T stops only after the amplitude sampling algorithm 300A is finished. If at 322 the amplitude sampling algorithm 300A is running, the time sampling algorithm 300T continues at 322 and waits at 324 until a ZCD event is detected. The dT is calculated at 326 between the current ZCD event time and the previous ZCD event time. The dT is then converted to a frequency via 1/dT.

Once a frequency is obtained from the dT, the frequency bin (counter) that is closest to the calculated frequency is incremented at 328. At 330, if the bin that was incremented at 328 is less than a predefined amount or the corresponding index in the time sampling array is not empty, then at 332 the time sampling algorithm 300T again waits for the next ZCD event at 324. If the bin that was incremented is more than the predefined amount, the time is recorded at 334 in the corresponding index of the time sampling array.

FR Sampling Array Correlation

Figure 4:
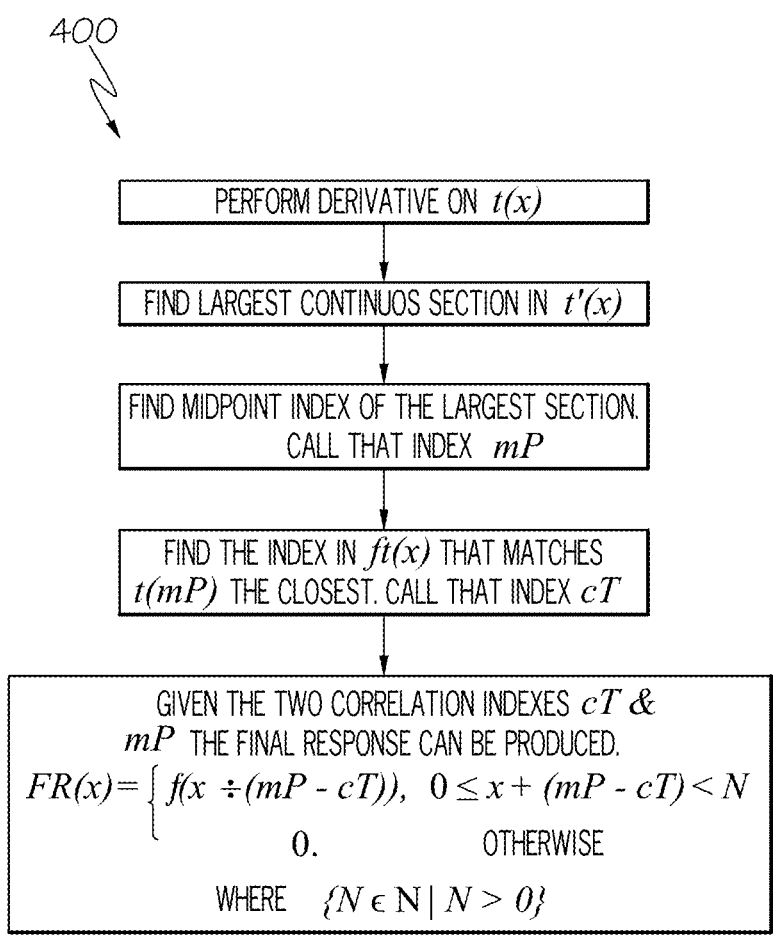
FIG. 4 is a flow chart illustrating an algorithm for correlating the sampling arrays obtain from the frequency response algorithm.

Once the FR Sampling Algorithm 300 is completed, three arrays of data are produced: 1) f(x)=amplitude sampling array; 2) ft(x)=amplitude sampling time array; and 3) t(x)=time sampling array. To produce the final frequency response array, the three arrays need to be correlated. FIG. 4 illustrates an embodiment of an algorithm 400 that can perform this function.

Time Alignment Detection

Figure 5:
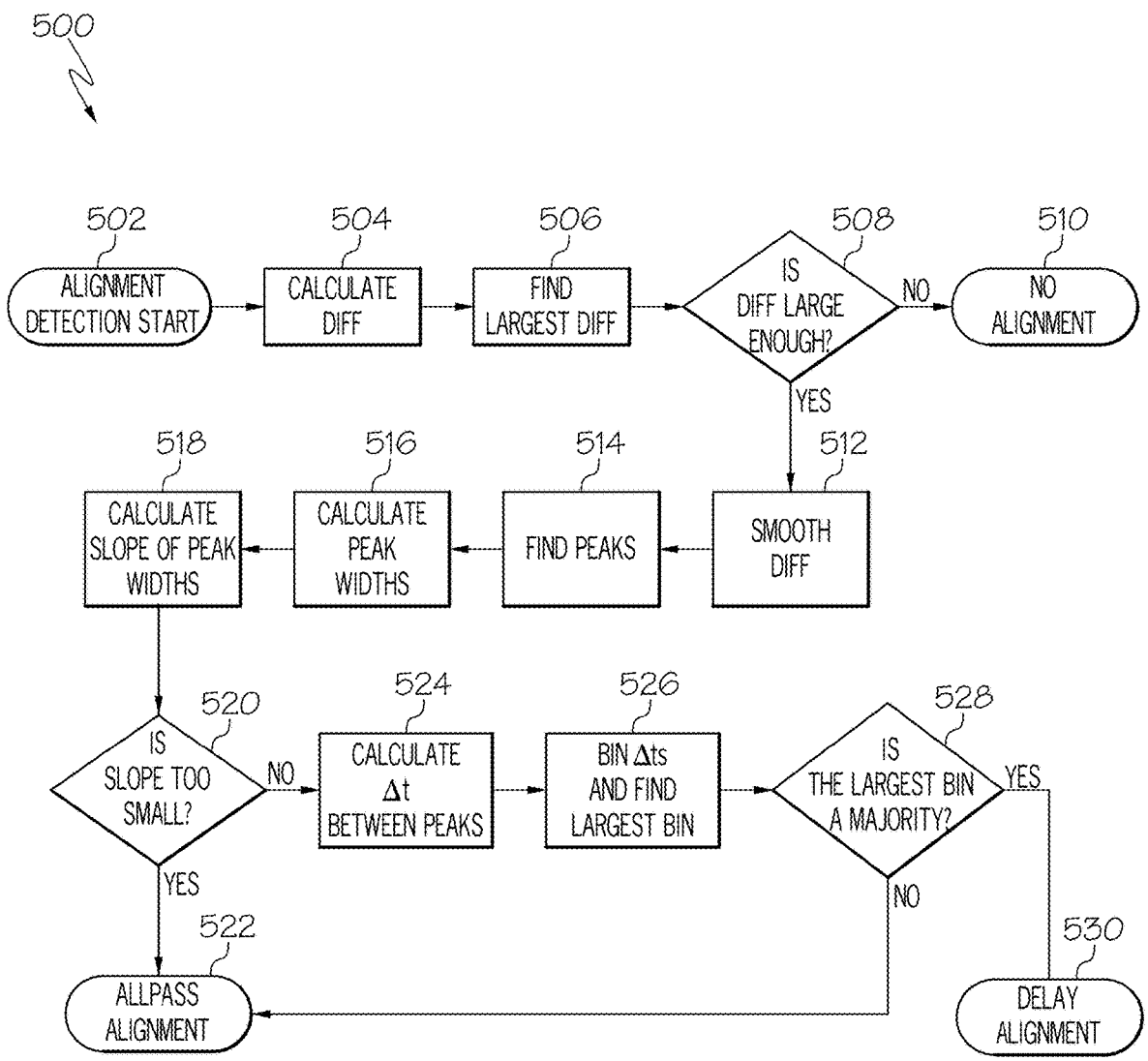
FIG. 5 is a flow chart illustrating an algorithm for time alignment detection that may be employed by the IU.

Once the three arrays are correlated, a time alignment process is performed at 212. The DUT 102 may use one of two different types of time alignment correction—all pass or time delay. The integration IU 110 may be programmed to detect which of these is used by the DUT. An embodiment of a preferred time alignment detection algorithm 500 is shown in FIG. 5.

The time alignment detection algorithm 500 commences at 502. First, the error between the sum and the (left+right) frequency responses is calculated at 504. The resulting difference is due to phase, the more out of phase the two channels are, the larger the difference between the (left+right) and the sum. To calculate this, the following function is used:

$$DA(x) = \frac{lFR(x) + rFR(x)}{2} - sFR(x)$$

The resulting difference array is scanned for the largest difference at 506, this indicates the frequency at which the DUT 102 was most out of phase. The largest difference is then compared with a predefined value at 508 to ensure that the DUT went sufficiently out of phase. If not, then the process stops at 510 as no alignment is needed.

To mitigate sampling errors, the difference array is smoothed by convolving the difference array with a simple Gaussian distribution at 512. To find where the DUT summed response is most out of phase, the peaks inside of the difference array are identified at 514. Each peak in the diff array corresponds to a null in the DUT's summed frequency response. A null is where the one channel goes 180 degrees out of phase with the other channel. To discern the Q of the null, the algorithm at 516 looks at nearest place in the derivative of the diff array that crosses zero from the peak.

In delay alignment, each successive null in the diff graph will have a smaller width. Given this, at 518 we calculate the slope of the widths vs null number from the first null in the diff graph. If the slope is smaller than a predefined amount at 520, the algorithm 500 assumes there is allpass alignment at 522.

Another feature of delay alignment is every null is a fixed distance from each other in Hz. To detect the distance between each peak, at 524 the D.t is calculated from each peak in the diff array. Next at 526 the algorithm 500 bins (stores) each D.t. It also finds the largest bin. At 528, if the largest bin is larger than the sum of all other bins by a predefined amount, the algorithm 500 assumes there is time delay alignment at 530. If the largest bin is not larger than the sum of all other bins by a predefined amount, the algorithm 500 assumes there is allpass alignment at 522.

Time Delay Presumption ("TDP")

Figure 6:
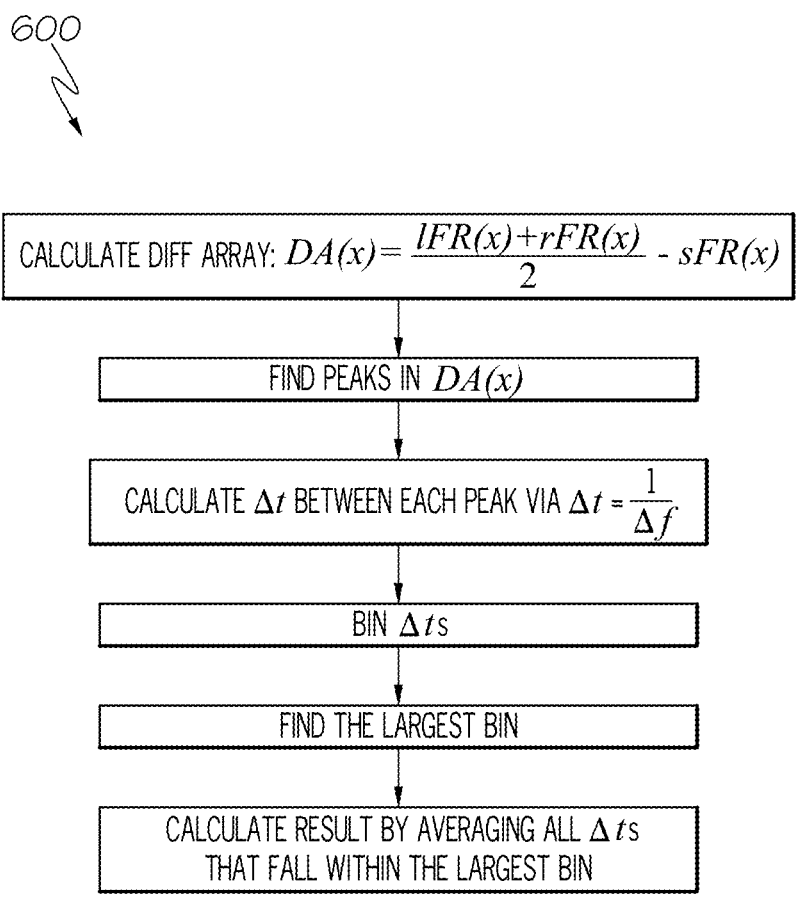
FIG. 6 is a flow chart illustrating an algorithm for calculating the amount of delay when time alignment is detected.

Returning to FIG. 2, if at 214, no time delay is detected, then at 218 the process repeats the delineation subroutine described previously. If time delay alignment is detected at 214, the amount of delay next is calculated at 216. An algorithm for performing this calculation is shown in FIG. 6. Unfortunately, the channel the delay is applied on cannot be discerned from the diff array because it shows only amplitude due to absolute phase difference. As such, once the presumed time delay has been calculated, it is applied to an arbitrary channel. Then, the DUT's frequency response is obtained a second time (FIG. 3) at 220.

Once the FR has been calculated a second time at 220, and if the Time Alignment Detection algorithm 500 at 212 determined there was time delay ("yes" at 222), then the Time Delay Presumption ("TDP") algorithm (FIG. 6) is repeated at 224. If the second time delay presumption is greater than the original presumption, then the time delay was applied to the incorrect channel. However, if the second time delay presumption is less than the original presumption, or there are no nulls in the difference array, the time delay was applied to the correct channel.

Real-Time Time Delay Correction ("RTC TD")

Figure 7:
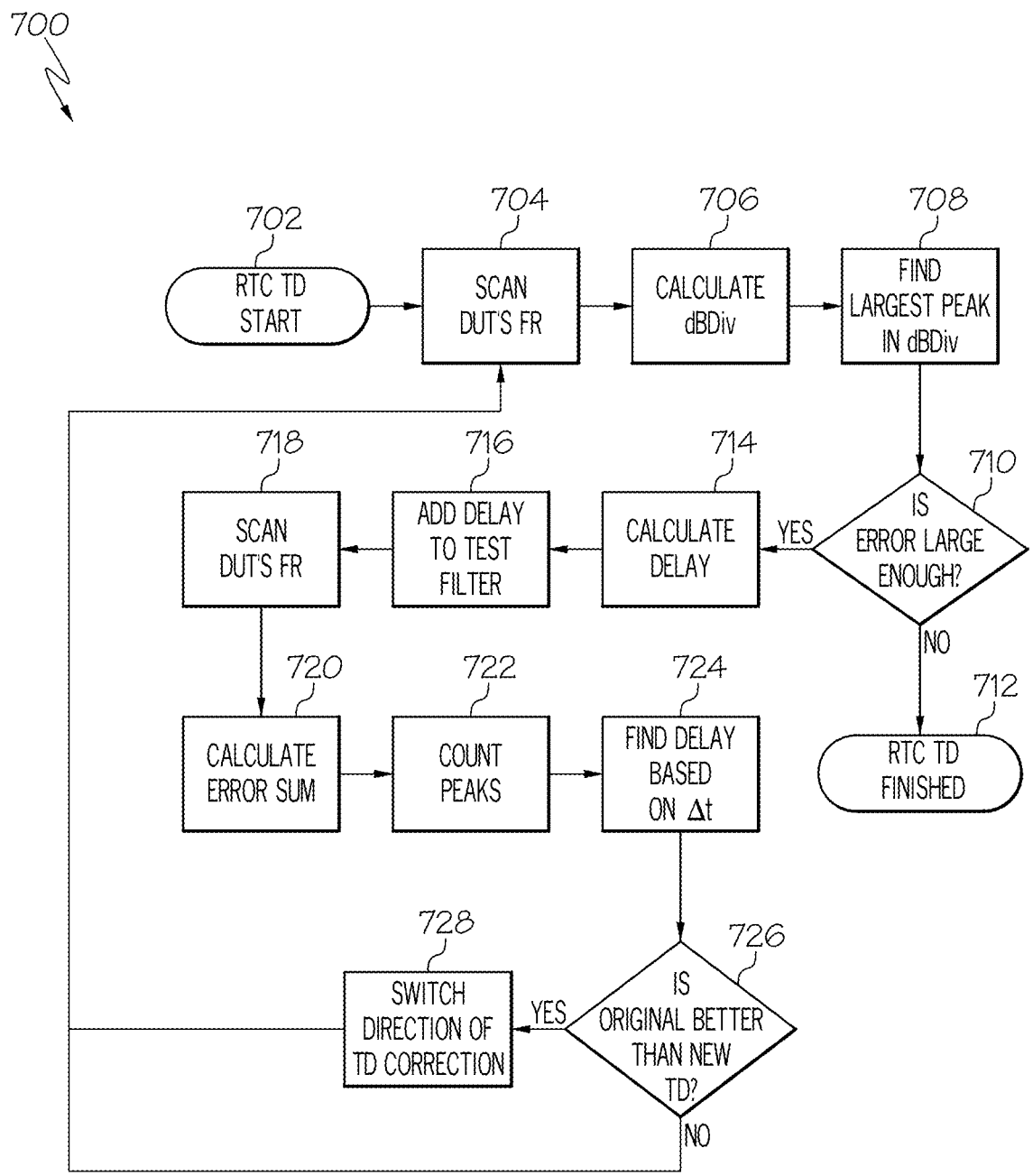
FIG. 7 is a flow chart illustrating an algorithm for refining the correction of time delay.

Due to sampling error and resolution, the time delay can never be calculated perfectly from the TDP algorithm (FIG. 6). An algorithm may be used at 226 (FIG. 2) to refine the time delay. One suitable algorithm 700 is shown in FIG. 7.

First, after the algorithm starts at 702, the current time delay is located. To do this, the DUT's FR is scanned at 704 over a predefined range at 704. Since the difference array can only show amplitude error due to absolute phase, it cannot be used to determine the channel(s) on which the time delay or allpass filter is applied. To account for this the integration IU 110 uses a real time analytical trial and error approach. This is referred to herein as Real Tim Frequency Response Sampling ("RTFRS") To facilitate sampling the DUT 102 in real time, multiple high Q variable frequency bandpass filters are used to isolate frequencies of interest. The amplitudes from these bandpass filters are then averaged over a predefined amount of time to obtain the DUT's amplitude level for a given frequency.

Next, at 706 the error due to phase is determined. The following function may be used:

$$dBDiv(x) = 20 * \log_{10}\left(\frac{lFR(x) + rFR(x)}{2 * sFR(x)}\right).$$

This is referred to herein as OFRdB(x).

The fundamental null of a time delay filter will be 180 degrees out of phase at $$\frac{1}{2*\text{delay}} [\text{Hz}].$$

Functionally this means that the sum of both channels will be zero at the fundamental frequency. In general, the fundamental null is also the widest null in the comb filter. Given this, the largest peak in the dBDiv array is identified at 708 as it will indicate the amount of delay that still needs to be corrected.

Once the fundamental null is outside of the integration unit's frequency range, the largest peak will be caused by phase error from various filters implemented in the DUT 102. To avoid correcting the time delay with an incorrect value, the largest peak is compared to a predefined value at 710. If the error is not significant ("no" at 710), the algorithm ends at 712. If the error exceeds the predefined value ("yes" at 710), the DUT has gone out of phase enough to indicate there is still time delay that needs to be corrected and algorithm proceeds.

Next, at 714, by using the largest peak's frequency, a correction value can be obtained using this formula:

$$\frac{1}{2*\text{frequency}}$$

Unfortunately, the direction this delay correction needs to be added cannot be discerned from the dBDiv array. So, it is applied arbitrarily in one direction at 716.

The DUT's FR is then scanned again at 718 in the same manner as in step 704. Then the dB error is calculated. This array is called NFRdB(x).

To discern whether the correction was applied in the correct direction, the error sum needs to be calculated for both OFR and NFR. To obtain this error, the entire NFRdB(x) is summed into a single value at 720; the same is done for OFRdB(x).

Another way the correction's effect can be quantified is by counting the number of peaks at 722 in the respective dBDiv arrays. This is applicable because the comb filter caused by the time delay produces nulls out to infinity from the fundamental. Thus, if the correction was made in the right direction, the fundamental will be pushed further up in the frequency spectrum resulting in fewer nulls in the dBDiv graph.

The final way the correction can be quantified is by counting the Δt between each peak at 724 and then averaging these Δt to produce a time delay. Next, the three error checks then are compared to each other in a predefined way at 726 to determine the effect of the TD correction. If at 726 the time delay became longer, that is, if the original is better than the new delay ("yes" at 726), then the correction was applied in the wrong direction, and the direction of the correction is reversed at 728. If at 724 the time delay became shorter, that is, if the original is worse than the new delay ("no" at 724), then the correction was applied in the right direction. The algorithm repeats beginning at 704 until the error in step 710 is less than the predefined value and the algorithm ends at 712.

If at 724 the time delay became shorter, that is, if the original is worse than the new delay ("no" at 724), then the correction was applied in the right direction. The three error checks then are compared to each other in a predefined way to determine if the TD correction was applied in the right direction.

Time Alignment Error Gating

Having completed the Real-Time Time Delay Correction RTC TD algorithm 700 at 226 (FIG. 2), an algorithm 800 may be applied to verify the correction. Unfortunately, due to sampling error and the inherent instability from the RTFRS function, it is still possible to get an incorrect result from the RTC algorithms. To test the correction that has been applied, another test is performed at 228.

First, all time alignment corrections are removed from the test filter and the DUT's FR is obtained via RTFRS. Next, the error sum is found by applying the following function:

$$\text{error} = \sum_{n=0}^{N} 20 * \log_{10}\left(\frac{lRTFR(n) + rRTFR(n)}{2*sRTFR(n)}\right)$$

where 1) lRTFR(n) is the frequency response of DUT's channel 1 obtained from the RTFRS function; 2) rRTFR(n) is the frequency response of DUT's channel 2 obtained from the RTFRS function; 3) sRTFR(n) is the frequency response of DUT's sum channel obtained from the RTFRS function; and 4) {N∈N|N>0}.

After this the alignment corrections are reapplied, and the error is obtained in the same manner as before. Finally, the two errors are compared in a predefined way. If it is determined that the time alignment did not reduce the error enough, the integration IU 110 defaults the time alignment to "defeated."

Bass Correction

Returning to FIG. 2 at 230, to restore bass lost from highpass crossovers, the integration IU 110 uses lowshelf filters. The lowshelf filter's frequency, Q, and amplitude are found using the steps depicted in the flow chart of FIG. 8. The bass correction algorithm 800 commences at 801 and proceeds to find the highpass crossover at 804. For this, a crossover detection subroutine may be applied.

To identify a range for the correction, the passband of the DUT must be detected. A crossover is detected if any of these conditions are met: 1) the FR (the first derivative of the frequency response) indicates that the signal response has gone flat; 2) the FR goes above the zero level ("ZL"); or 3) the first or last sample in the FR is above the ZL—max gain level.

To detect the highpass crossover, the DUT's FR is scanned from start to end stopping when the crossover is detected. To detect the lowpass crossover, the FR is scanned from end to start stopping when the crossover is detected.

Figure 8:
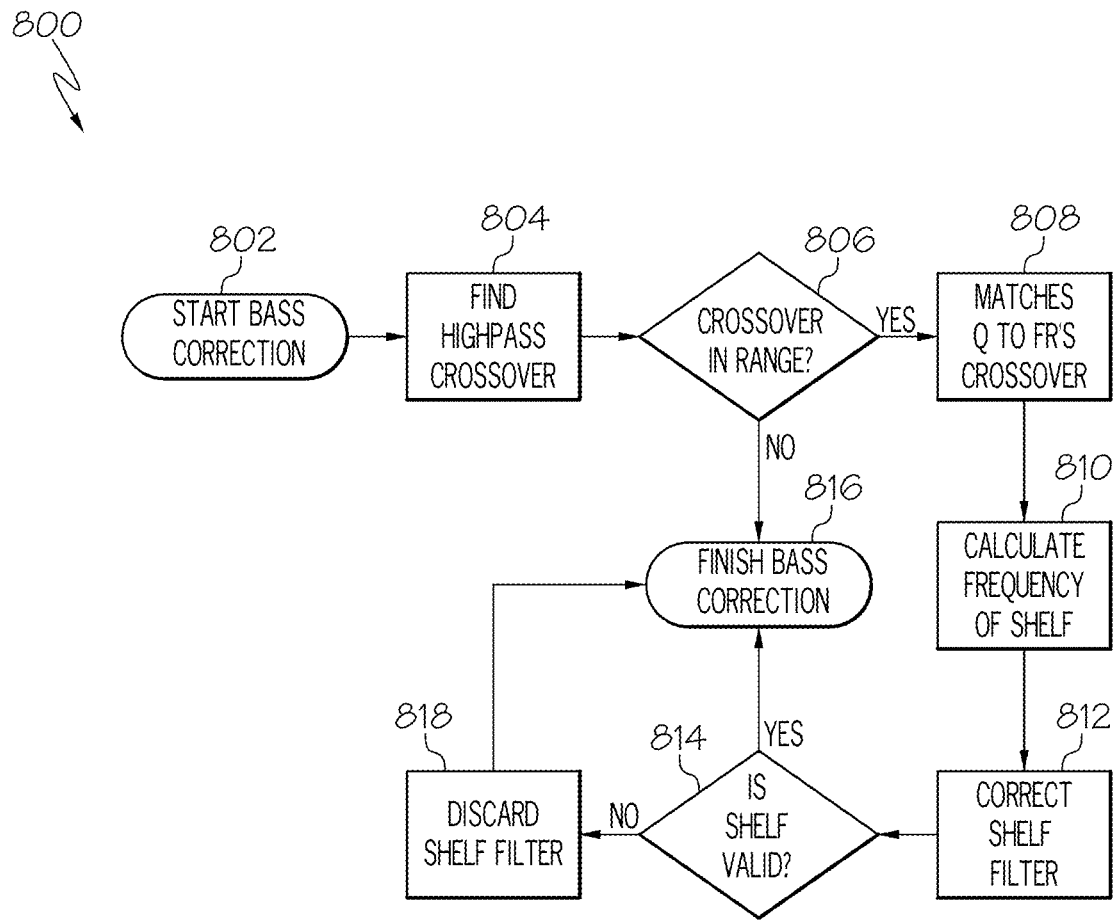
FIG. 8 is a flow chart illustrating a bass correction algorithm that may be employed by the IU.
Figure 9:
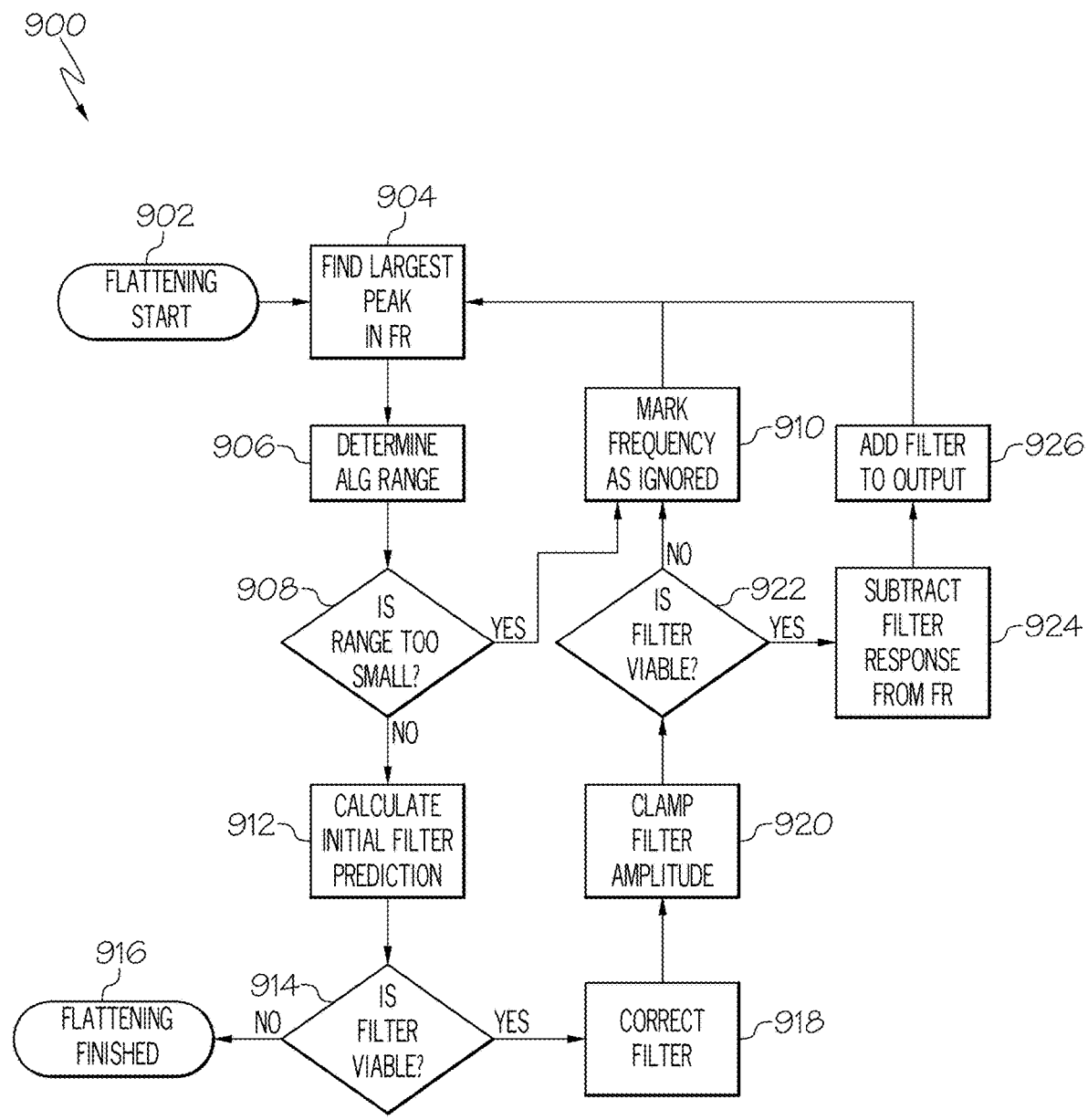
FIG. 9 is a flow chart illustrating an EQ flattening algorithm that may be employed by the IU.

The crossover is valid if it is within a predetermined frequency range and the minimum amplitude before the crossover is below a predetermined threshold at 806 in FIG. 8. At 808, the Q of the shelf filter is matched to the slope of the crossover. If the Q is not achievable, it is set to a predetermined maximum value. The frequency of the shelf filter is found at 810 by finding the −3 db point of the FR's crossover. The Frequency and Q of the shelf filter is adjusted at 812 to minimize error caused by adding the shelf filter to the DUT's FR.

The shelf filter is considered valid ("yes") at 814 if the DSP can render it and the amplitude is below a predetermined threshold, the algorithm ends at 816. When the bass correction is finished, the shelf filter that was calculated is passed to the DSP. If the shelf filter is invalid ("no") at 814, it is discarded at 818, no bass correction is implemented, and the algorithm ends at 816.

Zero Level Function

To effectively correct the DUT's FR, a zero level ("ZL") is needed to base the correction filters around. Zero level may be determined using the following:

$$\text{zero} = \frac{\sum_{n=0}^{N} f(n) * \gamma(n)}{\sum_{n=0}^{N} \gamma(n)}$$

where $$\gamma(x) = (1 - f'(x))^2 * \sum_{n=0}^{N} \begin{cases} 1, & f(x) - a < f(n) < f(x) + a \\ 0, & \text{otherwise} \end{cases}$$

and where 1) f(x) is the discrete frequency response of the DUT; 2) $\{N \in N | N > 0\}$; 3) $\{x \in N | 0 \leq x < N\}$; and, 4) $\{a \in R | a \geq 0\}$.

Effectively, this function scans the FR and weights each sample more the flatter the surrounding samples are and by how many samples are close to the current sample's amplitude.

EQ Flattening

Once the FR, zero level, and crossover have been acquired, the EQ Flattening algorithm 900 is engaged at 232 in the main algorithm 200 (FIG. 2). This algorithm uses peaking filters to flatten the FR to the zero level within a predetermined threshold. The algorithm is illustrated by the flow chart in FIG. 9

At 904, the peak with the largest amplitude in the FR relative to the zero level is located. Samples outside of the crossovers and samples that have been marked as "ignore" are ignored. Next, at 906 a range on either side of the peak is selected for correction at 906. At 908, the adequacy of the range is evaluated. The range is considered large enough ("no") if the algorithm can calculate a peaking filter using the range. If the range is too small ("yes") at 908, the frequency range is ignored 910 and the peak and range selections steps 904 and 906 are repeated.

If the range is large enough, at 912 the algorithm predicts the frequency, amplitude, and the Q of the peaking filter that will correct peak in the FR. At 914, viability of this filter is determined. The filter is considered viable ("yes") if its amplitude and q are above a predetermined value. If the filter is not viable, the algorithm ends at 916.

At 918, the filter is corrected to minimize the error between the predicted peaking filter and the response. Next, at 920, the amplitude of the corrected peaking filter is reduced if it is greater than the max gain ("MG") or max attenuation ("MA"). Again, at 922, the viability of the filter is assessed. The filter is considered viable if its amplitude is above a predetermined minimum threshold.

If the filter not viable, it is marked "ignore" at 910 so the algorithm knows not to fix that frequency. If the filter is viable at 922, the corrected filter's FR is subtracted at 924 from the input FR center around the zero level. At 926, the corrected filter is added to the list of filters required to correct the input FR.

The algorithm 900 is complete at 234 (FIG. 2) when there are no more peaks above the predetermined threshold. Once the flattening algorithm 900 has finished, any unused filters are set to passive and the entire filter chain is passed to the DSP.

Real Time Allpass Correction ("RTC AP")

Figure 10:
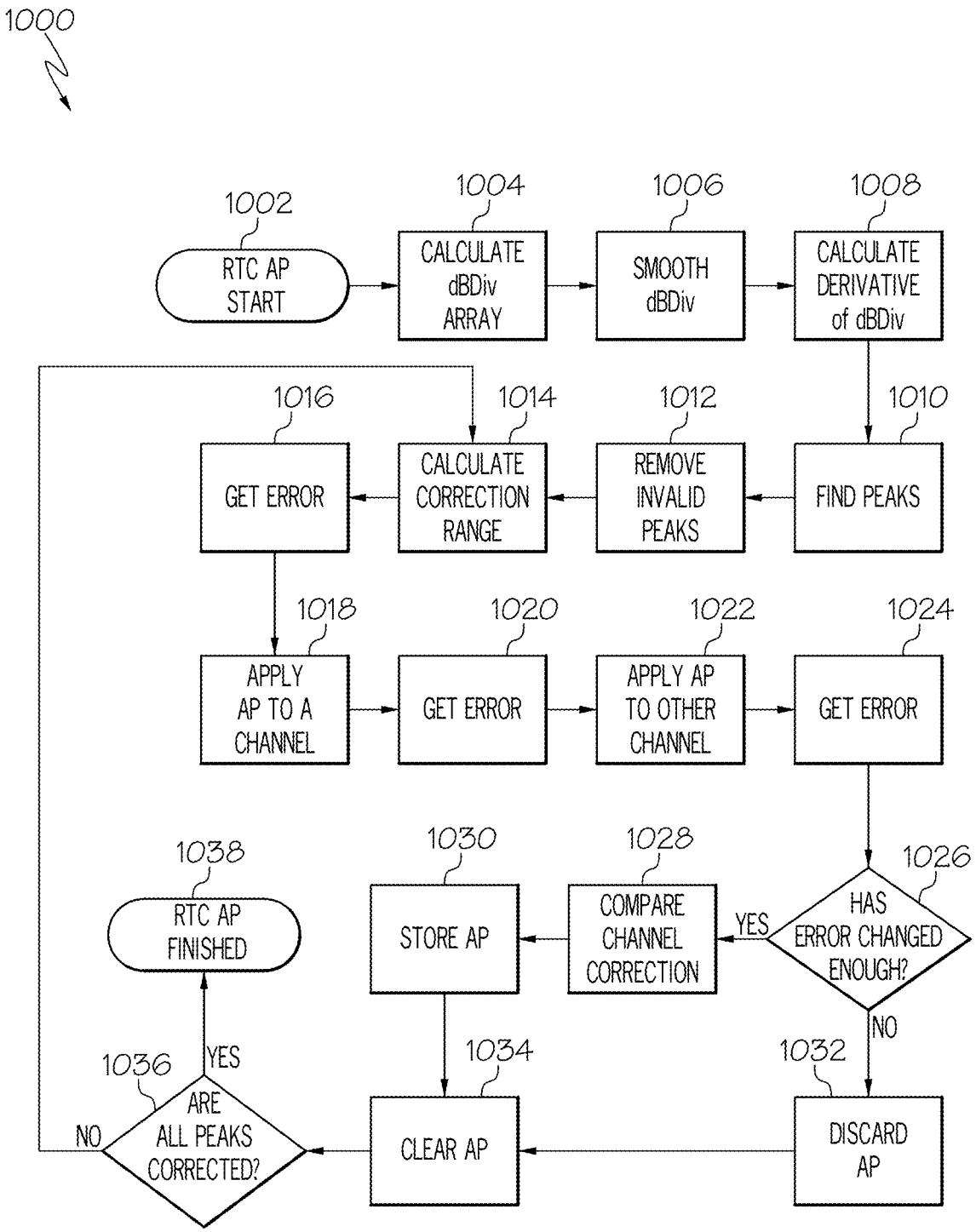
FIG. 10 is a flow chart illustrating an algorithm for real time allpass correction that may be employed by the IU.

Returning to step 222 in the main algorithm 200 (FIG. 2), if no time delay is detected, the algorithm continues to 240. If no allpass filters are detected, the main algorithm 200 proceeds to Bass Correction 230 described previously. If all pass filters are detected ("Yes") at 240, a Real Time Allpass Correction ("RTC AP") algorithm may be applied at 242. Allpass filters apply a 360° phase shift to the signal about their center frequency. These filters can be arbitrarily applied to either channel in the DUT. One embodiment of an RTC AP algorithm 1000 to correct to time delay in these filters is shown in FIG. 10.

The algorithm 1000 commences at 1002 and proceeds to step 1004. To find where the allpass filters ("AP") are in the DUT's FR, the algorithm 1000 needs to obtain the db division between the (left+right) and the sum. Effectively, this is showing the error due to phase without factoring in amplitude. The dBDiv may be calculated at 1004 using the following formula:

$$dBDiv(x) = 20 * \log_{10}\left(\frac{lFR(x) + rFR(x)}{2 * sFR(x)}\right)$$

Since the dBDiv tends to exaggerate sampling error, the dBDiv array is smoothed at 1006 by convolving it with a simple Gaussian distribution.

To find the peaks of dBDiv array, the derivative is calculated at 1008 with respect to frequency. For every place the dBDiv crosses the zero line with a negative slope, a peak is detected at 1010. If the (lFR(peak)+rFR(peak)) amplitude is below a predefined threshold, the invalid peak is removed at 1012.

To obtain an accurate error from the DUT, the frequency range on which the scan will be performed needs to be determined. This is done at 1014 by finding where the amplitude begins to go in a different direction from the peak frequency in the dBDiv array.

First, at 1016, the RTFRS (described above) is run over the frequency correction range. Next, the error is obtained by preforming the following function:

$$\text{error} = \sum_{n=0}^{N} 20 * \log_{10}\left(\frac{lRTFR(n) + rRTFR(n)}{2 * sRTFR(n)}\right)$$

where 1) lRTFR(n) is the frequency response of DUT's channel 1 obtained from the RTFRS function; 2) rRTFR(n) is the frequency response of DUT's channel 2 obtained from the RTFRS function; 3) sRTFR(n) is the frequency response of DUT's sum channel obtained from the RTFRS function; and 4) $\{N \in N | N > 0\}$. This is referred to as the "noAPerror."

Next, at 1018, the AP is applied to an arbitrary channel. Then, at 1020, the error caused by the AP is calculated in the same manner as in previous step 1016. The is referred to herein as "ch1APerror."

At 1022, the channel that the AP is applied to is switched at 1022. Again, at 1024, the error caused the AP is calculated in the same manner as in previous step 1016. This is referred to as the "ch2APError."

At 1026, the extent of error correct is assessed. If the AP being applied to either of the channels has corrected the original error more than a predefined minimum amount, the AP is said to exist ("yes" at 1026). In this case, the ch1APerror and the ch2APerror are compared at 1028 to determine to which channel the AP filter needs to be applied. Then, at 1030, the channel and frequency of the AP is recorded so it can be implemented in the final filter. If, at 1026, the extent of error correction is insufficient, then at 1032, it is discarded. Moving to step 1034, the AP (discarded or stored) is cleared from the test filter so it does not affect subsequent AP error calculations.

At 1036, the algorithm queries if all the peaks have been corrected. If not, the algorithm repeats the process beginning at stop 1014. If so, the RTC AP algorithm is finished at 1038, and the main algorithm 200 resumes at 228 to perform Time Alignment Error Gating at 228 as described previously.

Range Detection

To give the user an idea of the range the DUT is capable of, a frequency range detector is used. The range detector operates in two modes: passive and algorithmic.

In passive mode the algorithm consists of several high pass and low pass filters to block out certain ranges of signal from the DUT. Each of these ranges is integrated over a predefined amount of time, this value is then converted to dBfs and compared to a predetermined threshold. Any range above the threshold is said to be a usable frequency and is displayed to the user.

In algorithm mode, the corrected FR is analyzed over certain ranges. If the number of FR samples that are above a predetermined threshold in a range exceed fifty percent (50%) of the total range, then that range is considered valid. After analysis, the valid ranges are stored in memory and displayed to the user every time the integration IU 110 is powered up.

The embodiments shown and described above are exemplary. Many details are often found in the art and, therefore, many such details are neither shown nor described herein. It is not claimed that all the details, parts, elements, or steps described and shown herein are newly invented. Changes may be made in the details, especially in matters of shape, size, and arrangement of the parts, within the principles of the invention to the full extent indicated by the broad meaning of the terms in the attached claims. The description and drawings of the specific embodiments herein do not point out what an infringement of this patent would be, but rather provide non-limiting examples of how to use and make the invention. Likewise, the abstract is neither intended to define the invention, which is measured by the claims, nor is it intended to be limiting as to the scope of the invention in any way. The limits of the invention and the bounds of the patent protection are measured by and defined in the following claims.

What is claimed is:

1. A method for re-tuning an analog audio signal output from a factory-installed source unit to an augmented load in a vehicle sound system, wherein the source unit outputs at least a first channel and a second channel, the method using an integration unit between the source unit and the augmented load, the method comprising:

adjusting the gain of the analog audio signal from the source unit for digitization to produce a gain-adjusted analog audio signal;

digitizing the gain-adjusted analog audio signal to produce a gain-adjusted digital audio signal;

processing the gain-adjusted digital audio signal to produce a re-tuned digital audio signal, wherein the processing comprises:

determining the frequency response of the source unit;

flattening the frequency response;

determining if time alignment is present in the source unit by determining the difference between the frequency response of the first and second channels individually and summed and comparing the phase difference to a predefined value indicating the presence of time alignment;

if time alignment is present, assuming the source unit is using an allpass filter for time alignment if the slope of the nulls in the summed frequency response is equal to or greater than a predefined value;

if time alignment is present, assuming the source unit is using time delay for time alignment if the slope of the nulls in the summed frequency response is smaller than a predefined value; and correcting the time alignment for the augmented load;

converting the re-tuned digital audio signal to produce a re-tuned analog audio signal; and outputting the re-tuned analog audio signal to the augmented load.

2. The method of claim 1 wherein the correction of the time alignment comprises:

determining the amount of phase difference present in the source unit;

detecting on which of the first and second channels the time alignment is applied; and adjusting the time alignment relative to the augmented load.

3. An integration unit for automated retuning of an audio signal output from a factory-installed source unit to an augmented load in a vehicle sound system, wherein the source unit outputs at least a first channel and a second channel, the integration unit comprising:

an analog input gain control configured to receive and adjust the gain of the audio signal from the source unit;

an analog-to-digital converter configured to receive the gain-adjusted analog signal from the gain control and to output a digital signal;

a processor configured to receive the digital signal from the analog-to-digital converter and programmed to produce a re-tuned digital signal by:

determining the frequency response of the source unit;

flattening the frequency response;

determining if time alignment is present in the source unit by determining the difference between the frequency response of the first and second channels individually and summed and comparing the phase difference to a predefined value indicating the presence of time alignment;

if time alignment is present, assuming the source unit is using an allpass filter for time alignment if the slope of the nulls in the summed frequency response is equal to or greater than a predefined value;

if time alignment is present, assuming the source unit is using time delay for time alignment if the slope of the nulls in the summed frequency response is smaller than a predefined value; and correcting the time alignment for the augmented load;

a digital-to-analog converter configured to receive the re-tuned digital signal from the processor and to output a re-tuned analog signal; and an analog output gain control configured to receive and adjust the re-tuned analog signal from the digital-to-analog converter and to output the gain-adjusted re-tuned analog signal to the augmented load.

4. The integration unit of claim 3 wherein the processor comprises a microcontroller coupled to a digital signal processor.

5. A method for re-tuning an analog audio signal output from a factory-installed source unit to an augmented load in a vehicle sound system, wherein the source unit outputs at least a first channel and a second channel, the method using an integration unit between the source unit and the augmented load, the method comprising:

adjusting the gain of the analog audio signal from the source unit for digitization to produce a gain-adjusted analog audio signal;

digitizing the gain-adjusted analog audio signal to produce a gain-adjusted digital audio signal;

processing the gain-adjusted digital audio signal to produce a re-tuned digital audio signal, wherein the processing comprises:

determining the frequency response of the source unit;

flattening the frequency response;

determining if time alignment is present in the source unit by determining the difference between the frequency response of the first and second channels individually and summed and comparing the phase difference to a predefined value indicating the presence of time alignment;

if time alignment is present, detecting the distances between nulls in the summed frequency response, comparing the largest distance to the sum of the remaining distances;

assuming the source unit is using time delay for time alignment if the difference between largest distance and the sum of the remaining distances is less than or equal to a predefined value;

and assuming the source unit is using an allpass filter for time alignment if the difference between largest distance and the sum of the remaining distances exceeds a predefined value;

correcting the time alignment for the augmented load; and converting the re-tuned digital audio signal to produce a re-tuned analog audio signal; and outputting the re-tuned analog audio signal to the augmented load.

6. The method of claim 5 wherein the correction of the time alignment comprises:

determining the amount of phase difference present in the source unit;

detecting on which of the first and second channels the time alignment is applied; and adjusting the time alignment relative to the augmented load.

7. An integration unit for automated retuning of an audio signal output from a factory-installed source unit to an augmented load in a vehicle sound system, comprising:

an analog input gain control configured to receive and adjust the gain of the audio signal from the source unit;

an analog-to-digital converter configured to receive the gain-adjusted analog signal from the gain control and to output a digital signal;

a processor configured to receive the digital signal from the analog-to-digital converter and programmed to produce a re-tuned digital signal by:

determining the frequency response of the source unit;

flattening the frequency response;

determining if time alignment is present in the source unit by determining the difference between the frequency response of the first and second channels individually and summed and comparing the phase difference to a predefined value indicating the presence of time alignment;

if time alignment is present, detecting the distances between nulls in the summed frequency response, comparing the largest distance to the sum of the remaining distances;

assuming the source unit is using time delay for time alignment if the difference between largest distance and the sum of the remaining distances is less than or equal to a predefined value;

and assuming the source unit is using an allpass filter for time alignment if the difference between largest distance and the sum of the remaining distances exceeds a predefined value;

correcting the time alignment for the augmented load;

a digital-to-analog converter configured to receive the re-tuned digital signal from the processor and to output a re-tuned analog signal; and an analog output gain control configured to receive and adjust the re-tuned analog signal from the digital-to-analog converter and to output the gain-adjusted re-tuned analog signal to the augmented load.

8. The integration unit of claim 7 wherein the processor comprises a microcontroller coupled to a digital signal processor.

* * * * *